(12) United States Patent
Shimizu

(10) Patent No.: US 6,846,721 B2
(45) Date of Patent: Jan. 25, 2005

(54) MANUFACTURING METHOD OF SEMICONDUCTOR DEVICE

(75) Inventor: Shu Shimizu, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 177 days.

(21) Appl. No.: 10/160,052

(22) Filed: Jun. 4, 2002

(65) Prior Publication Data

US 2003/0100167 A1 May 29, 2003

(30) Foreign Application Priority Data

Nov. 28, 2001 (JP) .................................. 2001-362030

(51) Int. Cl.⁷ .................. H01L 21/76; H01L 21/8242; H01L 21/336
(52) U.S. Cl. .................. 438/425; 438/243; 438/246; 438/248; 438/259; 438/424; 438/426; 438/429; 438/430; 438/439
(58) Field of Search .................. 438/243, 246, 438/248, 259, 424, 425, 426, 429, 430, 439

(56) References Cited

U.S. PATENT DOCUMENTS

| | | | |
|---|---|---|---|
| 5,310,692 A | * | 5/1994 | Chan et al. .................. 438/449 |
| 5,721,174 A | | 2/1998 | Peidous |
| 5,834,360 A | * | 11/1998 | Tesauro et al. .............. 438/445 |
| 5,972,776 A | * | 10/1999 | Bryant ........................ 438/440 |
| 6,017,800 A | * | 1/2000 | Sayama et al. .............. 438/296 |
| 6,350,655 B2 | | 2/2002 | Mizuo |
| 6,372,606 B1 | * | 4/2002 | Oh .............................. 438/435 |

FOREIGN PATENT DOCUMENTS

JP          11-26572           1/1999

* cited by examiner

*Primary Examiner*—John F. Niebling
*Assistant Examiner*—Stanetta Isaac
(74) *Attorney, Agent, or Firm*—McDermott, Will & Emery

(57) ABSTRACT

A semiconductor device ensuring an isolation of elements by a trench is provided. A method of manufacturing the semiconductor device includes the step of forming a silicon nitride film having an aperture, the step of selectively removing a part of a silicon substrate along aperture to form a recess defined by a side surface and a bottom surface in silicon substrate, the step of oxidizing the side surface and the bottom surface of the recess to form a thermal oxide film having a side portion and a bottom portion, and the step of selectively removing bottom portion of thermal oxide film and a part of silicon substrate by using silicon nitride film as a mask to form a trench.

5 Claims, 11 Drawing Sheets

MANUFACTURING METHOD OF SEMICONDUCTOR DEVICE

BACKGROUND OF THE INVENTION

Field of the Invention

The present invention relates to a semiconductor device and a manufacturing method thereof. More particularly, the present invention relates to a semiconductor device having a trench for isolation of elements and a manufacturing method thereof.

In a conventional semiconductor device, it is known to use a trench isolation to isolate semiconductor elements formed on a semiconductor substrate. FIGS. 16–21 are cross-sectional views showing conventional method of manufacturing a semiconductor device. Referring to FIG. 16, a thermal oxide film 2 of about 20 nm in thickness is formed on a surface represented by (001) plane of a silicon substrate 1. Then, a silicon nitride film 3 of about 200 nm in thickness is formed on thermal oxide film 2. A resist is applied on silicon nitride film 3, and a resist pattern 4 is formed by patterning the resist by photolithography. Silicon nitride film 3 and thermal oxide film 2 are dry-etched by using resist pattern 4 as a mask. A part of silicon substrate 1 is also etched in this step to form a recess 1h.

Referring to FIG. 17, after removing resist pattern 4, silicon substrate 1 is dry-etched by using patterned silicon nitride film 3 and thermal oxide film 2 as a mask. This forms a trench 7 of about 300 nm in depth.

Referring to FIG. 18, plasma is used to form trench 7 by etching. A surface of the trench is thermally oxidized for the purpose of removing a layer damaged by plasma and of making a corner portion 7c of trench 7 rounded to avoid an electric field concentration at corner portion 7c. This forms a thermal oxide film 5 of about 30 nm in thickness.

Referring to FIG. 19, silicon oxide film 9 of about 500 nm in thickness is formed. This silicon oxide film 9 fills trench 7.

Referring to FIG. 20, silicon oxide film 9 is removed to expose silicon nitride film 3. Silicon oxide film 9 is removed by a method such as a chemical mechanical polishing (CMP) or an etch back.

Referring to FIG. 21, after silicon oxide film 9 is wet-etched to a prescribed amount by hydrofluoric acid, silicon nitride film 3 is removed by hot phosphoric acid. This forms a shallow trench isolation (STI) 10. Thereafter, an n-type well, a p-type well, a gate oxide film, a gate electrode, a source-drain region, etc. are formed to make an element such as a transistor.

A problem caused by the conventional manufacturing method will be described below. FIG. 22 is a cross-sectional view showing a problem caused by the conventional manufacturing process. Referring to FIG. 22, thicker thermal oxide film 5 formed by thermal oxidation is more preferable to further round corner portion 7c of trench 7. Therefore, it is conceivable to thicken thermal oxide film 5 (to 60 nm, for example) by increasing an amount of thermal oxidation, as shown in FIG. 22. However, as the amount of thermal oxide film 5 is increased, an aperture width W2 of trench 7 seen from a surface side of silicon substrate 1 will become smaller than an aperture width W1 of trench 7 shown in FIG. 18. This would make the step of filling trench 7 with silicon oxide film 9 more difficult, and the filling efficiency will be decreased. Therefore, the isolation of elements cannot be ensured and a reliability of the semiconductor device will be decreased.

SUMMARY OF THE INVENTION

An object of the present invention is to solve the above-mentioned problem and to provide a highly reliable semiconductor device.

A method of manufacturing a semiconductor device according to the present invention includes the step of forming a mask layer having a first aperture on a main surface of a semiconductor substrate including silicon, the step of selectively removing a part of the semiconductor substrate along the first aperture by using the mask layer as a mask to form a recess defined by a side surface and a bottom surface in the semiconductor substrate, the step of oxidizing the side surface and the bottom surface of the recess to form a first silicon oxide film having a side portion and a bottom portion, the step of selectively removing the bottom portion of the first silicon oxide film and a part of the semiconductor substrate by using the mask layer as a mask to form a trench, and the step of oxidizing a surface of the trench.

According to the method of manufacturing a semiconductor device including such steps, a trench is formed after the side surface and the bottom surface of the recess are oxidized to form a silicon oxide film having a side portion and a bottom portion, and then a surface of the trench is oxidized. Therefore, the side portion of the recess is oxidized in two steps, that is, the step of forming the first silicon oxide film and the following step of oxidizing a surface of the trench, while the most part of the trench surface is oxidized once. With this, a corner portion of the trench will be oxidized in a larger amount because the portion is oxidized twice. This can avoid an electric field concentration at the corner portion of the trench. Furthermore, as the other portions of the trench surface are oxidized only once, an aperture diameter of the trench will not be too small. As a result, filling of the trench with insulating film in the following step will be easier, so that a highly reliable semiconductor device can be provided.

Preferably, the method of manufacturing a semiconductor device further includes the step of forming a second silicon oxide film on a main surface of the semiconductor substrate prior to the step of forming the mask layer. The step of forming the recess includes the step of removing a part of the second silicon oxide film to form a second aperture continuing from the first aperture in the second silicon oxide film, and the step of removing a part of the semiconductor substrate to form the recess continuing from the second aperture. Since the silicon oxide film is formed between the mask layer and the semiconductor substrate, the mask layer can be prevented from applying stress or the like to the semiconductor substrate. Preferably, the step of forming the first silicon oxide film includes the step of forming the first silicon oxide film such that it continues from the portion of the second silicon oxide film that defines the second aperture. Preferably, the method of manufacturing a semiconductor device further includes the step of forming a polysilicon layer between the second silicon oxide film and the mask layer. The step of forming the recess includes the step of removing a part of the polysilicon layer to form a third aperture continuing from the first aperture in the polysilicon layer and the step of forming a second aperture and the recess continuing from the third aperture. The step of forming the first silicon oxide film includes the step of oxidizing the portion of the polysilicon layer that defines the third aperture to form the first silicon oxide film. This can thicken the silicon oxide film because the polysilicon layer is also oxidized to form the first silicon oxide film.

Therefore, the electric field concentration at corner portion of the trench can further be mitigated. Preferably, the step of forming the polysilicon layer includes the step of forming a belt-shaped conductive layer to be a floating gate electrode. The method further includes the step of patterning the belt-shaped conductive layer to form a floating gate electrode after forming the trench. Since a side wall portion of the belt-shaped conductive layer is oxidized, the silicon oxide film at this portion will become thicker. Then, when the belt-shaped conductive layer is patterned to form the floating gate electrode, a silicon oxide film extending from the floating gate electrode to the trench is formed. As a result, the corner portion of the trench can be rounded, and a non-volatile semiconductor memory device which can mitigate the electric field concentration can be provided. Preferably, the step of forming the trench includes the step of removing the bottom portion and leaving the side portion of the first silicon oxide film. Since the side portion of the first silicon oxide film remains, the silicon oxide film at this portion will become thicker and the electric field concentration at the corner portion of the trench can be mitigated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to the drawings.

First Embodiment

Figure 1:
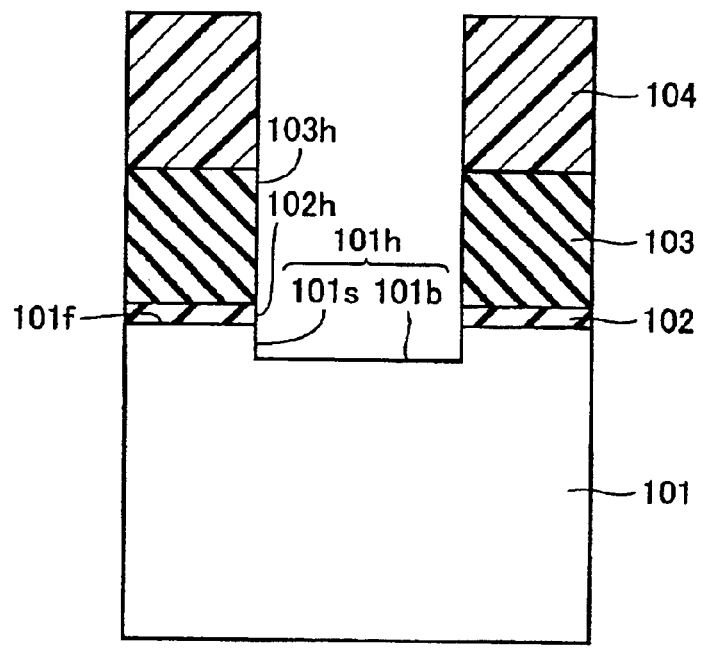
FIGS. 1 to 8 are cross-sectional views showing first to eighth steps of a method of manufacturing a semiconductor device according to a first embodiment of the present invention.

Referring to FIG. 1, a thermal oxide film 102 as a second silicon oxide film of about 20 nm in thickness is formed on a surface of a silicon substrate 101. A silicon nitride film 103 of about 200 nm in thickness is formed on thermal oxide film 102. A resist is applied on silicon nitride film 103, and a resist pattern 104 is formed by patterning the resist. Silicon nitride film 103, thermal oxide film 102 and silicon substrate 101 are dry-etched by using resist pattern 104 as a mask. This forms an aperture 103h as a first aperture in silicon nitride film 103 as a mask layer. An aperture 102h as a second aperture continuing from the first aperture is formed in thermal oxide film 102. A recess 101h having a side surface 101s and a bottom surface 101b, which is continuing from the first and second apertures, is formed in silicon substrate 101.

Figure 2:
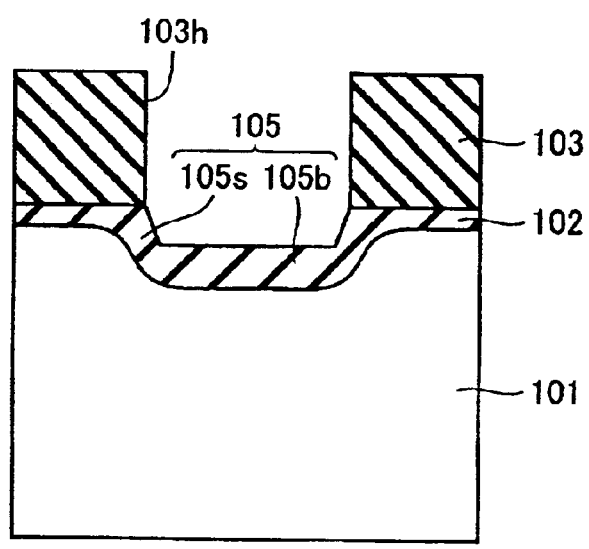

Referring to FIG. 2, resist pattern 104 is removed. Then, a thermal oxide film 105 as a first silicon oxide film of about 30 nm in thickness is formed by thermal oxidation. Thermal oxide film 105 is continuing from the portion of thermal oxide film 102 that defines aperture 102h, and has a side portion 105s formed by oxidation of side surface 101s and a bottom portion 105b formed by oxidation of bottom surface 101b.

Figure 3:
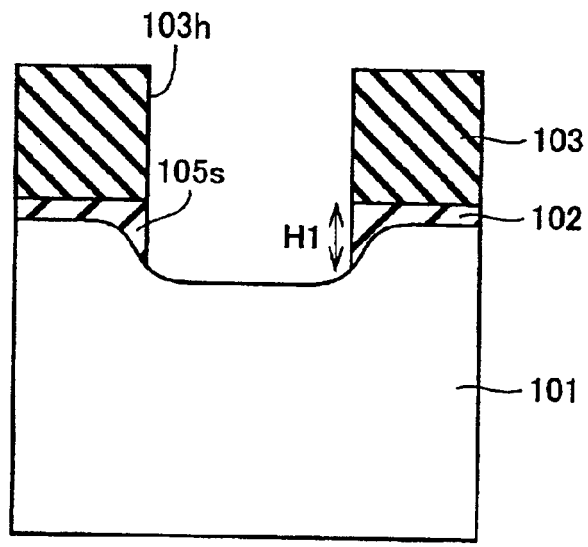

Referring to FIG. 3, thermal oxide film 105 is dry-etched by using patterned silicon nitride film 103 and thermal oxide film 102 as a mask. This removes bottom portion 105b and leaves side portion 105s of thermal oxide film 105. In a thickness H1 of the portion of remaining side portion 105s, the silicon oxide film is thicker than thermal oxide film 102, and this side portion 105s exists as a bird's beak.

Figure 4:
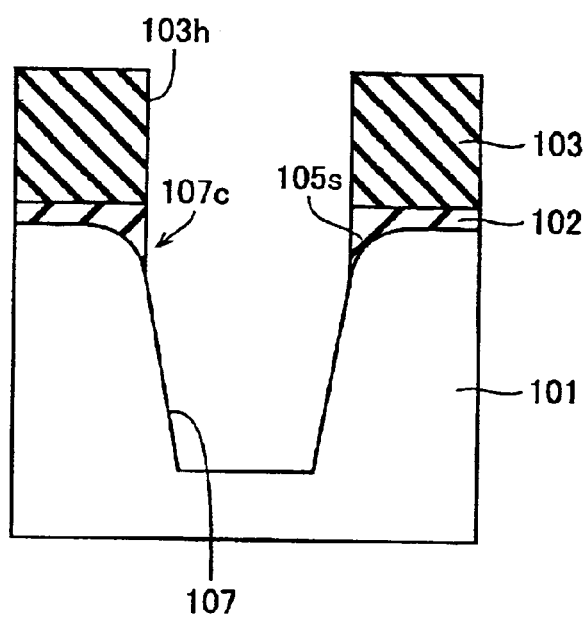

Referring to FIG. 4, a trench 107 of about 300 nm in depth is formed by dry-etching (plasma etching) silicon substrate 101 to remove a part of silicon substrate 101 along aperture 103h.

Figure 5:
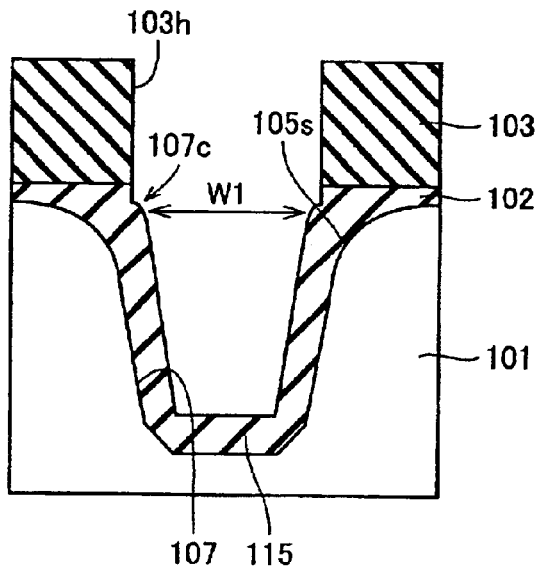
Figure 22:
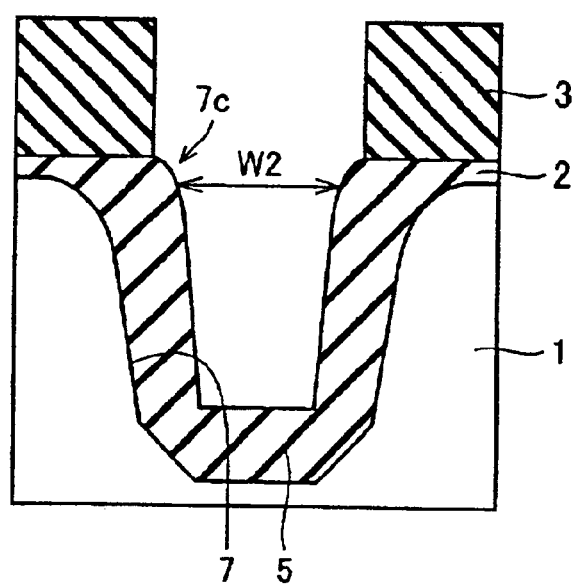
FIG. 22 is a cross-sectional view showing a problem caused by a conventional manufacturing process.

Referring to FIG. 5, a surface of trench 107 is thermally oxidized for the purpose of removing a layer damaged by plasma etching for forming trench 107 and of making a corner portion 107c of trench 107 rounded to avoid an electric field concentration at corner portion 107c. This forms a thermal oxide film 115 of about 30 nm in thickness. Together with the step shown in FIG. 2, a thermal oxide film of about 60 nm in thickness is formed at corner portion 107c. An aperture width W1 of trench 107 seen from a main surface 101f of silicon substrate 101 will become larger than an aperture width W2 shown in FIG. 22.

Figure 6:
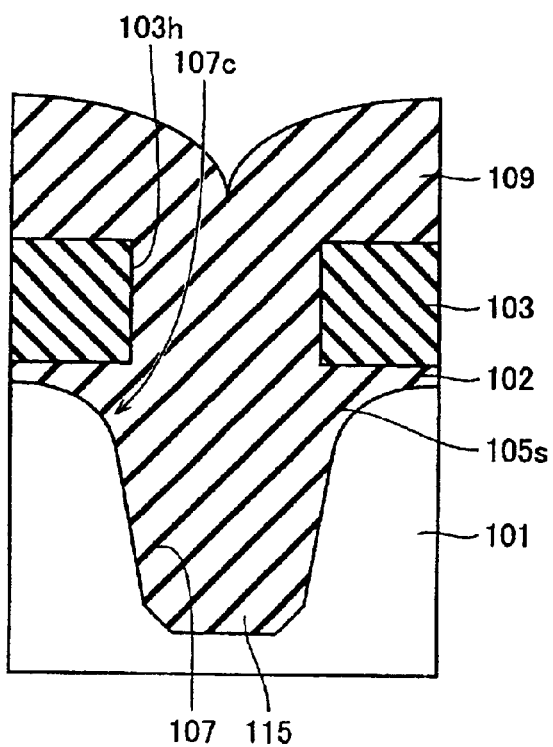

Referring to FIG. 6, trench 107 is filled with a silicon oxide film 109. Since trench 107 has an aperture width W1 larger than an aperture width W2 of the trench in FIG. 22, filling of trench 107 with silicon oxide film 109 becomes easier. Silicon oxide film 109 has a thickness of about 500 nm.

Figure 7:
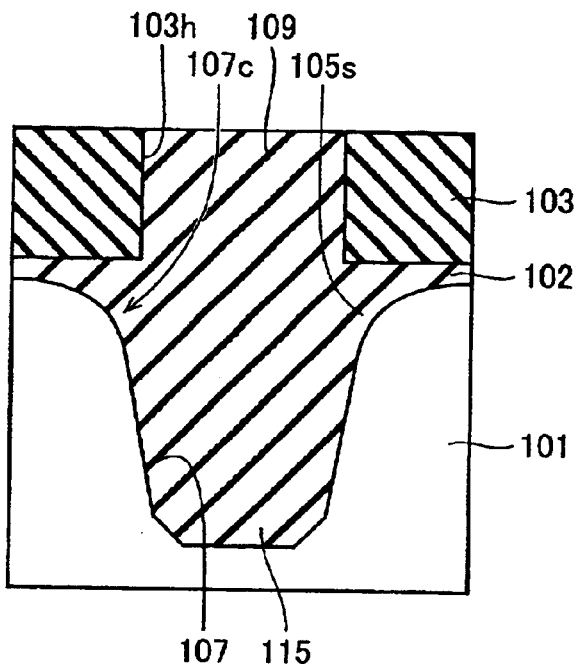

Referring to FIG. 7, silicon oxide film 109 is removed to expose a surface of silicon nitride film 103. It is removed by a method such as a CMP or an etch back.

Figure 8:
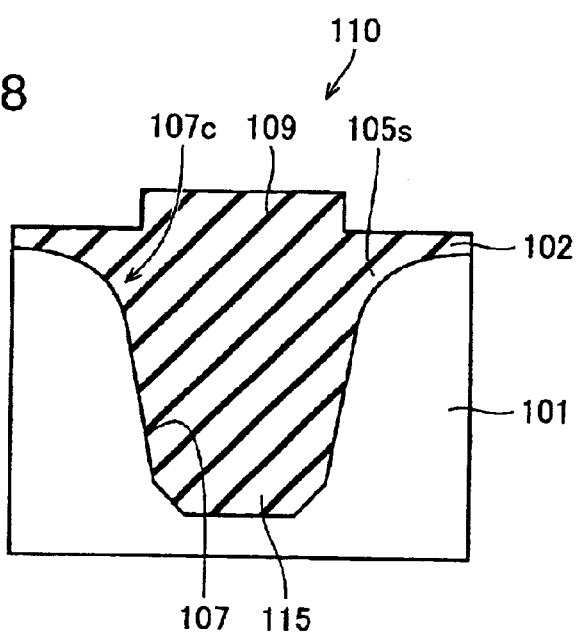

Referring to FIG. 8, silicon oxide film 109 is wet-etched to a prescribed amount by hydrofluoric acid. Then, silicon nitride film 103 is removed by hot phosphoric acid. With this, a shallow trench isolation 110 is completed.

In the method of manufacturing a semiconductor device according to the present invention as described above, corner portion 107c of trench 107 is oxidized twice in steps shown in FIGS. 2 and 5. Therefore, corner portion 107c can be rounded sufficient to mitigate the electric field concentration at this portion. Furthermore, the other portions of the surface of trench 107 are oxidized only once. As a result, since the width of trench 107 will not become smaller, the filling of trench 107 with silicon oxide film 109 will become easier.

Second Embodiment

Figure 9:
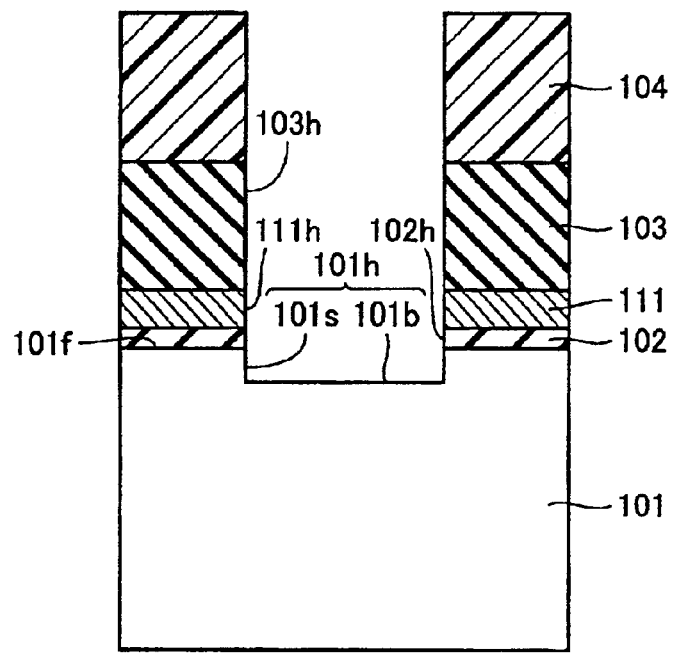
FIGS. 9 to 14 are cross-sectional views showing first to sixth steps of a method of manufacturing a semiconductor device according to a second embodiment of the present invention.

Referring to FIG. 9, thermal oxide film 102 is formed on main surface 101f of silicon substrate 101. A doped polysilicon film 111 as a polysilicon layer is formed on thermal oxide film 102. Silicon nitride film 103 and resist pattern 104 are formed on doped polysilicon film 111. Then, silicon nitride film 103, doped polysilicon film 111, thermal oxide film 102, and silicon substrate 101 are etched by using resist pattern 104 as a mask. This forms an aperture 111h as a third aperture in doped polysilicon film 111 in addition to apertures 103h and 102h and recess 101h similar to that of the first embodiment.

Figure 10:
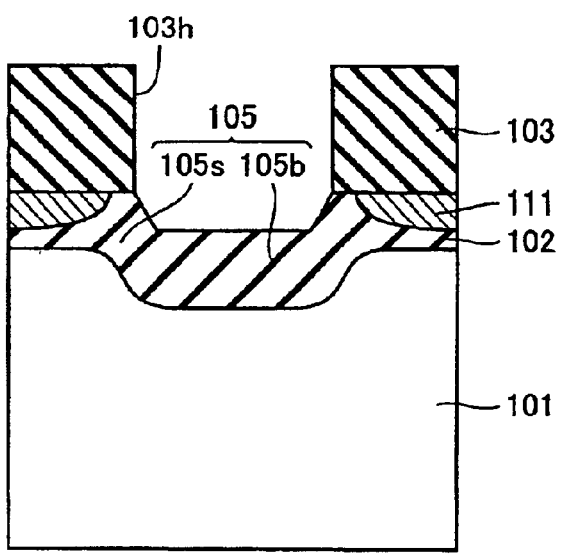

Referring to FIG. 10, after removing resist pattern 104, side surface 101s and bottom surface 101b of recess 111h and the portion of doped polysilicon film 111 that defines aperture 111h are thermally oxidized. This forms thermal oxide film 105 as a first silicon oxide film. Thermal oxide film 105 has side portion 105s formed by oxidation of side surface 101s and doped polysilicon film 111, and bottom portion 105b formed by oxidation of bottom surface 101b.

Figure 11:
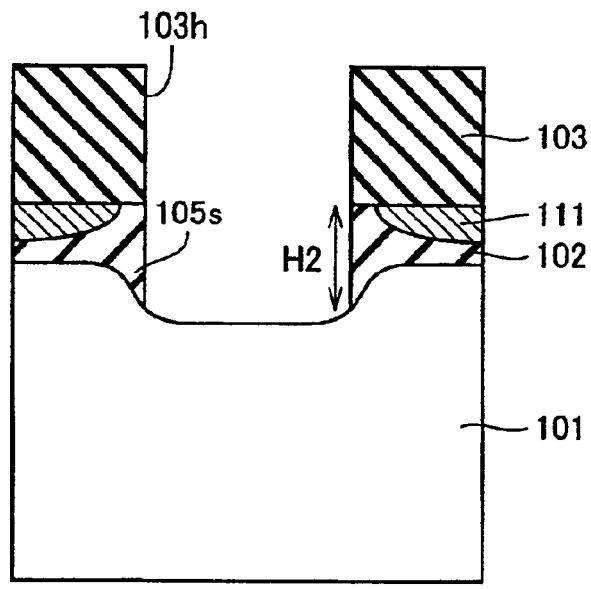

Referring to FIG. 11, thermal oxide film 105 is etched along aperture 103h. This removes bottom portion 105b and leaves side portion 105s of thermal oxide film 105. It should be noted that, a height H2 of side portion 105s is larger than a height H1 shown in FIG. 3 of the first embodiment.

Figure 12:
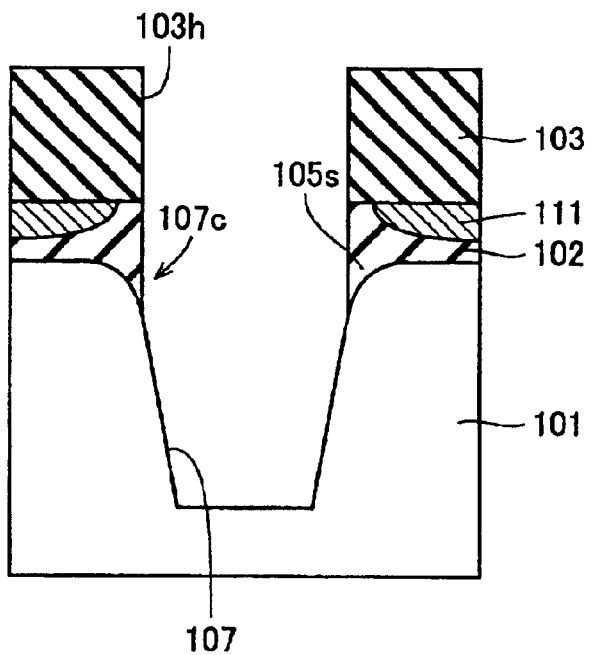

Referring to FIG. 12, silicon substrate 101 is then etched along aperture 103h by using silicon nitride film 103 as a mask. This forms trench 107.

Figure 13:
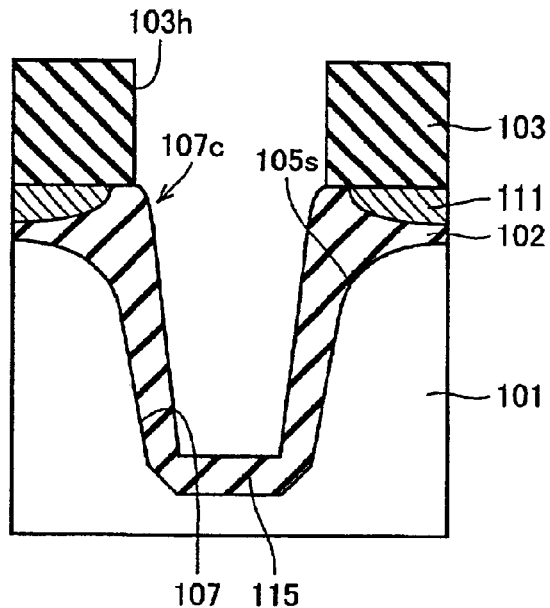

Referring to FIG. 13, a surface of trench 107 is thermally oxidized. This forms thermal oxide film 115. Since corner portion 107c of trench 107 is also oxidized, the thermal oxide film will become especially thick at this portion. In contrast, the portions other than corner portion 107c are thermally oxidized only once.

Figure 14:
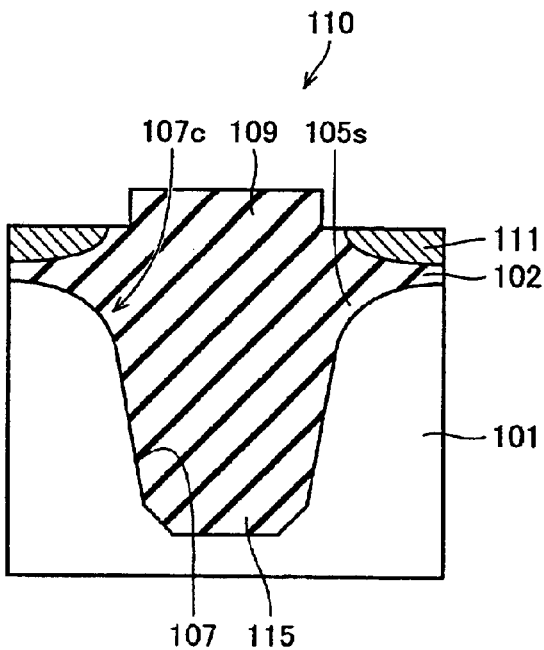

Referring to FIG. 14, trench 107 is filled with silicon oxide film 109 in accordance with the step similar to that of the first embodiment. Then, silicon nitride film 103 is removed to complete shallow trench isolation 110.

Such semiconductor device has an effect similar to that of the semiconductor device according to the first embodiment. Furthermore, as the portion of doped polysilicon film 111 that defines aperture 111h is also oxidized, the thermal oxide film will become especially thick at corner portion 107c of trench 107. As a result, the electric field concentration at corner portion 107c of trench 107 can be mitigated more than in the first embodiment.

Third Embodiment

In a third embodiment, a non-volatile semiconductor memory device is manufactured as a semiconductor device. Firstly, a belt-shaped conductive film is used as doped polysilicon film 111 shown in FIG. 14. A dielectric film consisting of a silicon oxide film, a silicon nitride film and a silicon oxide film, and a polysilicon film are formed on this belt-shaped conductive film.

Figure 15:
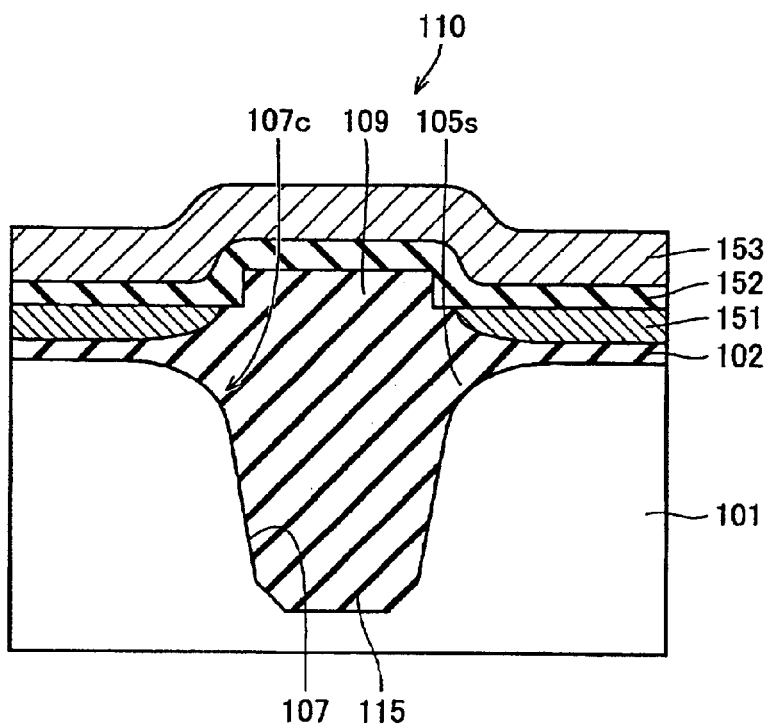
FIG. 15 is a cross-sectional view of a non-volatile semiconductor memory device according to a third embodiment of the present invention.
Figure 16:
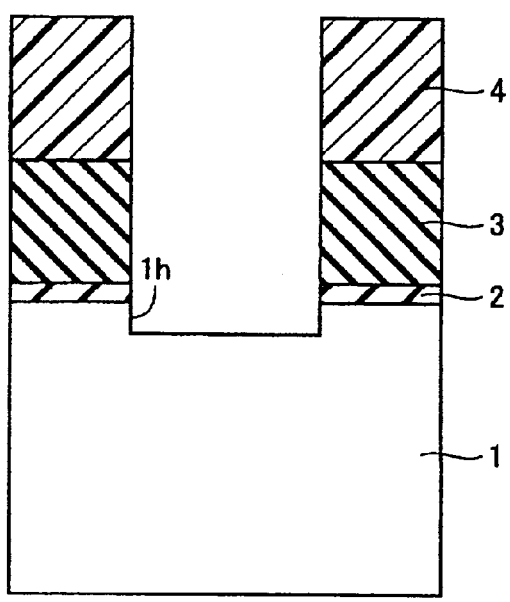
FIGS. 16 to 21 are cross-sectional views showing first to sixth steps of a conventional method of manufacturing a semiconductor device.
Figure 17:
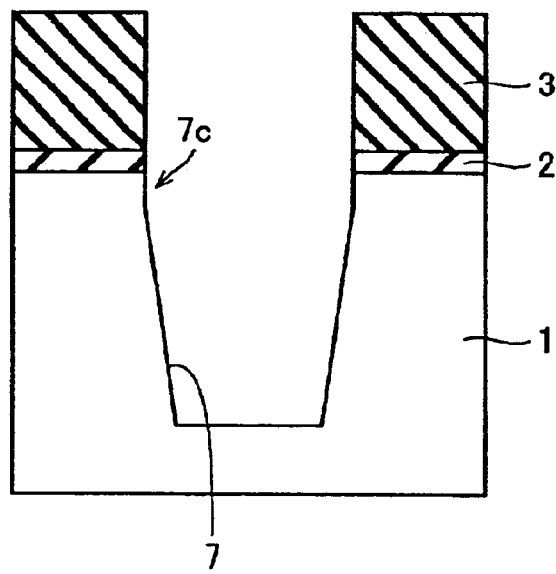
Figure 18:
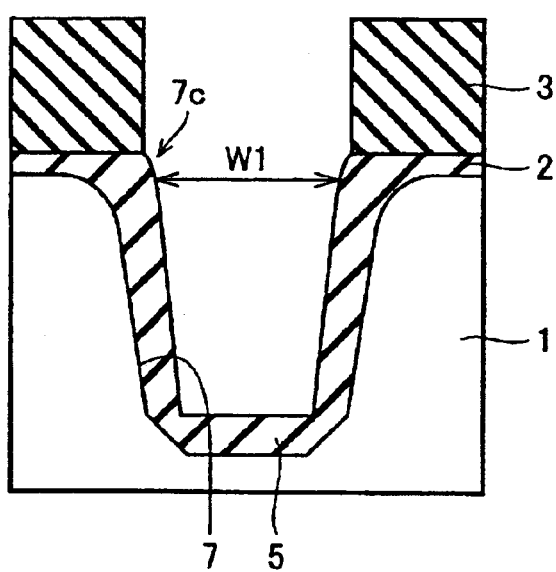
Figure 19:
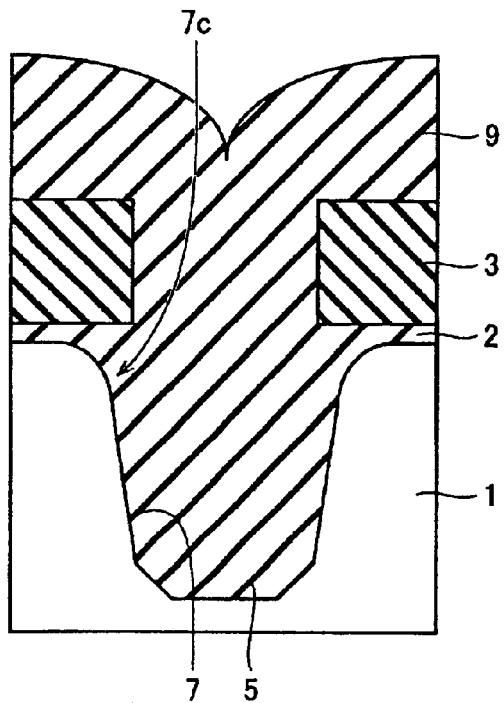
Figure 20:
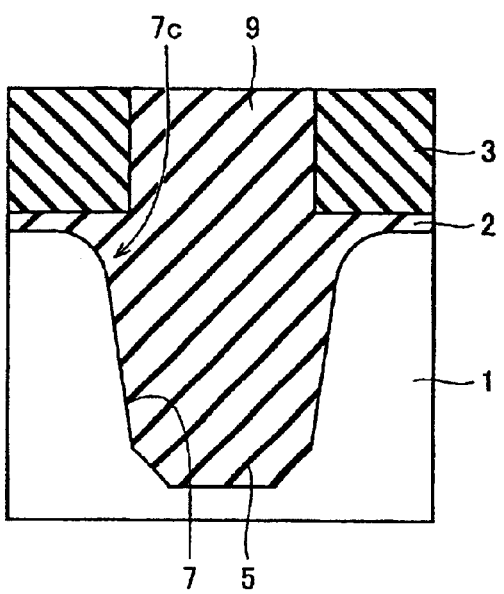
Figure 21:
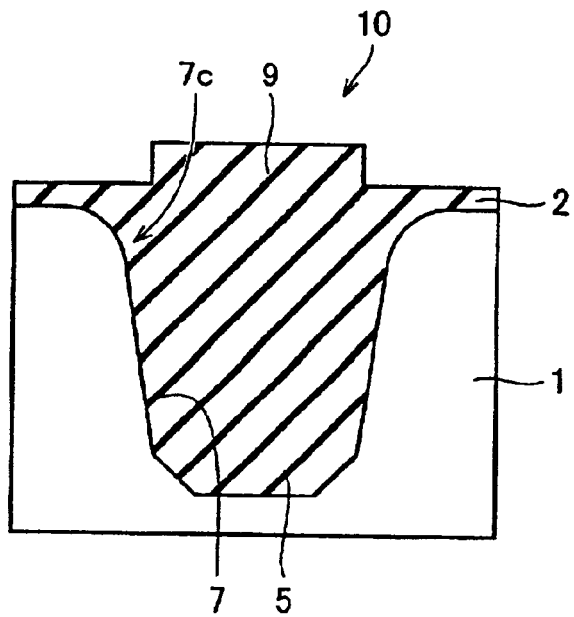

A resist pattern having a pattern of a control gate electrode is formed on the polysilicon film, and the polysilicon film, the dielectric film and the belt-shaped conductive film are etched in accordance with the resist pattern. This results in a non-volatile semiconductor memory device including a floating gate electrode 151, a dielectric film 152 and a control gate electrode 153 as shown in FIG. 15. Floating gate electrode 151 is obtained by etching of doped polysilicon film 111 as a belt-shaped conductive film.

The semiconductor device of the present invention, manufactured through the method including such steps, has an effect similar to that of the semiconductor device in accordance with the second embodiment. Furthermore, as the step of forming the belt-shaped conductive film to be the floating gate electrode can be followed immediately by the etching step of forming trench 107, the non-volatile semiconductor memory device can be provided without increasing the number of manufacturing steps.

Though embodiments of the present invention have been described, the embodiments shown can be modified to various forms. The semiconductor device having such shallow trench isolation can be used in a region isolating memory elements such as that of a dynamic random access memory (DRAM) or a static random access memory (SRAM). Furthermore, it can also be used for an element isolation in a logic region.

A semiconductor device ensuring an isolation of elements by a trench can be provided according to the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming a mask layer having a first aperture on a main surface of a semiconductor substrate including silicon;

selectively removing a part of said semiconductor substrate along said first aperture by using said mask layer as a mask to form a recess defined by a side surface and a bottom surface in said semiconductor substrate;

oxidizing the side surface and the and the bottom surface of said recess to form a first silicon oxide film having a side portion and a bottom portion;

selectively removing the bottom portion of said first silicon oxide film and a part of said semiconductor substrate by using said mask layer as a mask to form a trench; and thermal oxidizing a surface of said trench, the method further comprising the steps of:

forming a second silicon oxide film on a main surface of said semiconductor substrate prior to the step of forming said mask layer, wherein the step of forming said recess includes the step of removing a cart of said second silicon oxide film to form a second aperture continuing from said first aperture in said second silicon oxide film and the step of removing a part of said semiconductor substrate to form said recess continuing from said second aperture; and forming a polysilicon layer between said second silicon oxide film and said mask layer, wherein the step of forming said recess includes the step of removing a part of said polysilicon layer to form a third aperture continuing from said first aperture in said polysilicon layer and the step of forming a second aperture and said recess continuing from said third aperture, and wherein the step of forming said first silicon oxide film includes the step of oxidizing the portion of said polysilicon layer that defines said third aperture to form said first silicon oxide film.

2. The method according to claim 1, wherein the step of forming a first silicon oxide film includes the step of forming said first silicon oxide film such that it continues from the portion of said second silicon oxide film that defines said second aperture.

3. The method according to claim 1, wherein the step of forming said polysilicon layer includes the step of forming a belt-shaped conductive layer to be a floating gate electrode, said method further comprising the step of patterning said belt-shaped conductive layer to form a floating gate electrode after forming said trench.

4. The method according to claim 1, wherein
the step of forming said trench includes the step of removing the bottom portion and leaving the side portion of said first silicon oxide film.

5. The method according to claim 1, wherein
the step of forming said mask layer includes the step of forming said mask layer including a silicon nitride film.

* * * * *